(12) United States Patent
Uchiyama

(10) Patent No.: US 12,187,549 B2
(45) Date of Patent: Jan. 7, 2025

(54) PARTS SUPPLY APPARATUS

(71) Applicant: FUJI CORPORATION, Chiryu (JP)

(72) Inventor: Noboru Uchiyama, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 553 days.

(21) Appl. No.: 17/612,630

(22) PCT Filed: Jun. 5, 2019

(86) PCT No.: PCT/JP2019/022362
§ 371 (c)(1),
(2) Date: Nov. 19, 2021

(87) PCT Pub. No.: WO2020/245945
PCT Pub. Date: Dec. 10, 2020

(65) Prior Publication Data
US 2022/0219914 A1  Jul. 14, 2022

(51) Int. Cl.
*B65G 47/90* (2006.01)
(52) U.S. Cl.
CPC .................... *B65G 47/90* (2013.01)
(58) Field of Classification Search
CPC ...................................... B65G 47/90
See application file for complete search history.

(56) References Cited

U.S. PATENT DOCUMENTS

| | | | | |
|---|---|---|---|---|
| 5,503,516 A | * | 4/1996 | Kasai | B23P 19/001 414/800 |
| 6,012,891 A | * | 1/2000 | Timmins | B65G 65/23 414/421 |
| 7,452,175 B2 | * | 11/2008 | Martin | B65F 3/201 414/408 |
| 9,725,256 B1 | * | 8/2017 | Wang | B23P 19/04 |
| 2014/0199150 A1 | * | 7/2014 | Razumov | B65G 1/1378 414/800 |
| 2017/0238448 A1 | | 8/2017 | Iwaki | |

FOREIGN PATENT DOCUMENTS

| JP | 2019-81655 A | 5/2019 |
|---|---|---|
| WO | WO 2016/030946 A1 | 3/2016 |
| WO | WO 2016/071984 A1 | 5/2016 |

OTHER PUBLICATIONS

International Search Report mailed on Aug. 27, 2019 in PCT/JP2019/022362 filed on Jun. 5, 2019, (2 pages).

* cited by examiner

*Primary Examiner* — Gene O Crawford
*Assistant Examiner* — Ayodeji T Ojofeitimi
(74) *Attorney, Agent, or Firm* — Oblon, McClelland, Maier & Neustadt, L.L.P.

(57) ABSTRACT

A parts supply apparatus includes multiple parts containers configured to accommodate multiple parts, and a stage. The multiple parts containers are attached to the stage, and the multiple parts are scattered on the stage from the multiple parts containers.

5 Claims, 17 Drawing Sheets

PARTS SUPPLY APPARATUS

TECHNICAL FIELD

The present application relates to a parts supply apparatus including a stage in which parts are scattered.

BACKGROUND ART

Some parts supply apparatuses supply parts in a state of being scattered on a stage, as described in Patent Literatures below.

PATENT LITERATURE

Patent Literature 1: WO2016/030946
Patent Literature 2: WO2016/071984

BRIEF SUMMARY

Technical Problem

The present disclosure has an object of suitably supplying parts in a parts supply apparatus that includes a stage.

Solution to Problem

In order to solve the problems described above, the present specification discloses a parts supply apparatus that includes multiple parts containers configured to accommodate multiple parts, and a stage. The multiple parts containers are attached to the stage, and the multiple parts are scattered on the stage from the multiple parts containers.

Advantageous Effects

According to the present disclosure, parts from multiple parts containers are scattered on one stage. As a result, many types of parts can be supplied by a parts supply apparatus, and the parts can be suitably supplied.

DESCRIPTION OF EMBODIMENTS

Hereinafter, examples of the present disclosure will be described in detail as embodiments of the present disclosure with reference to the drawings.

(A) Configuration of Component Mounter

Figure 1:
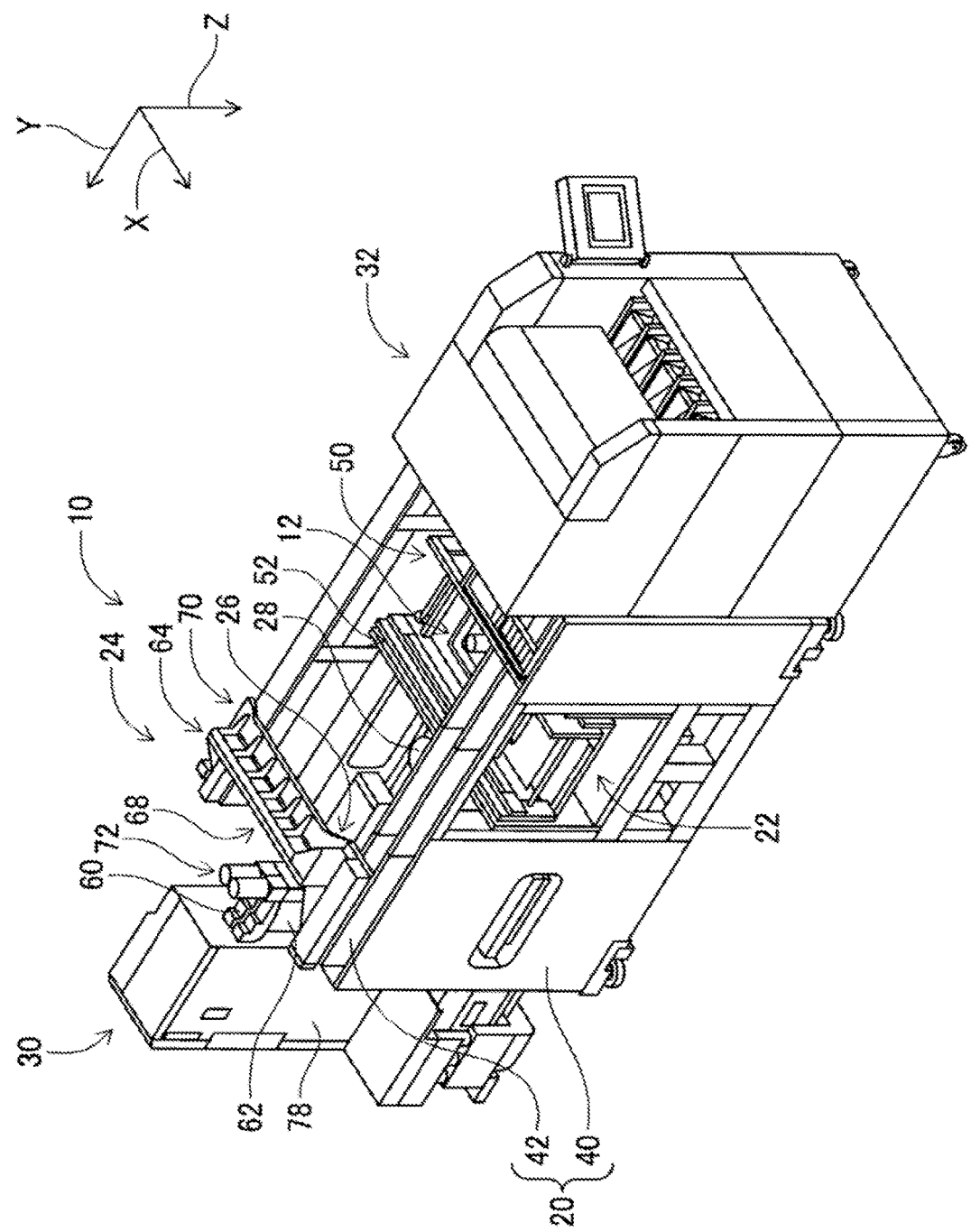
FIG. 1 is a perspective view showing a component mounter.

FIG. 1 shows component mounter 10. Component mounter 10 is a device for performing a component mounting work on circuit base material 12. Component mounter 10 includes device main body 20, base material conveyance holding device 22, component mounting device 24, imaging devices 26 and 28, parts supply apparatus 30, bulk parts supply apparatus 32, and control device (refer to FIG. 12) 34. Examples of circuit base material 12 include a circuit board and a base material having a three-dimensional structure, and examples of the circuit board include a printed wiring board and a printed circuit board.

Device main body 20 is configured with frame 40 and beam 42 mounted on frame 40. Base material conveyance holding device 22 is arranged at a center of frame 40 in the front-rear direction, and includes conveyance device 50 and clamping device 52. Conveyance device 50 is a device that conveys circuit base material 12, and clamping device 52 is a device that holds circuit base material 12. As a result, base material conveyance holding device 22 conveys circuit base material 12 and holds circuit base material 12 fixedly at a predetermined position. In the description below, the conveyance direction of circuit base material 12 is referred to as an X-direction, the horizontal direction perpendicular to that direction is referred to as a Y-direction, and the vertical direction is referred to as a Z-direction. That is, the width direction of component mounter 10 is the X-direction, and the front-rear direction is the Y-direction.

Figure 2:
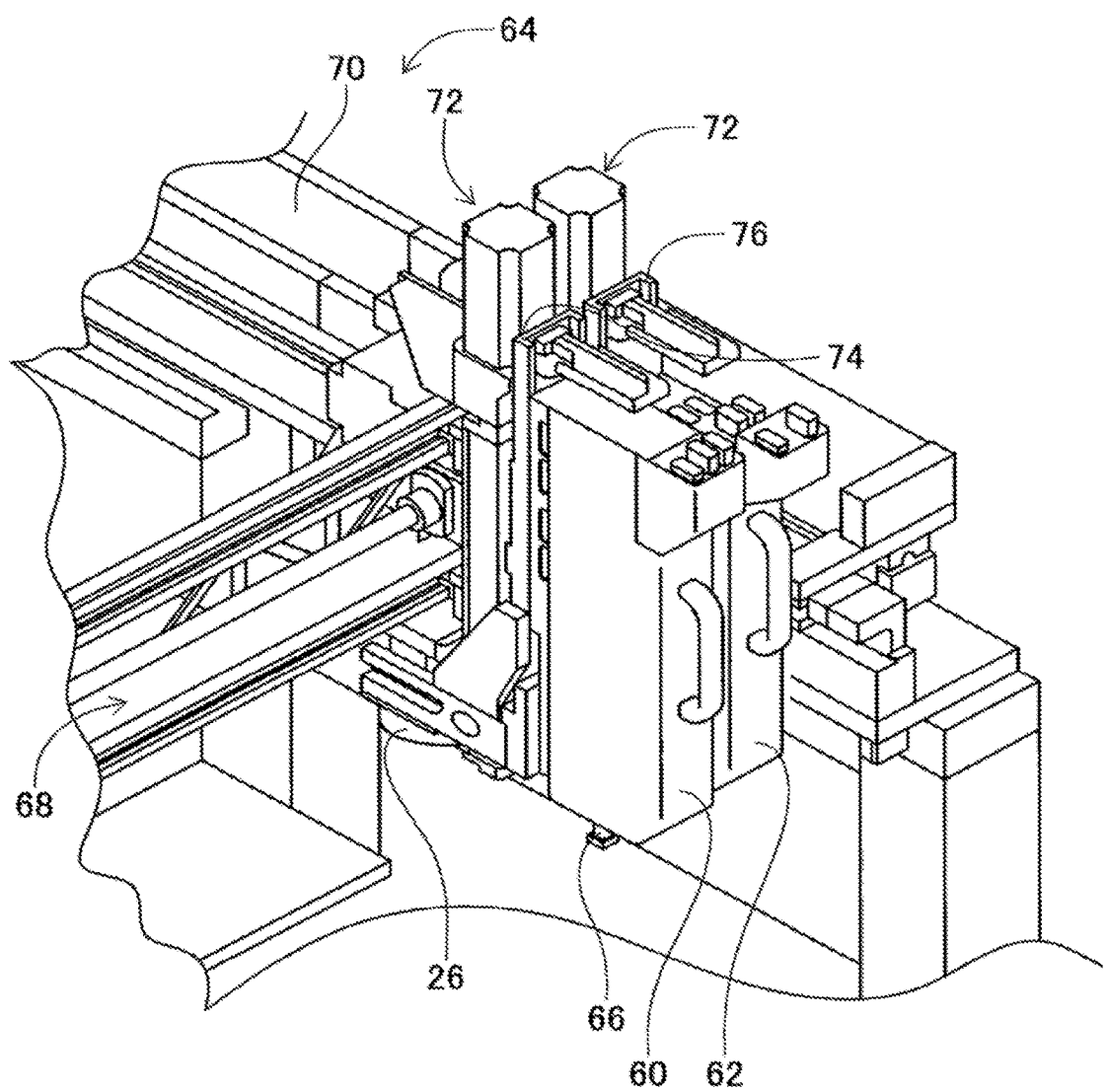
FIG. 2 is a perspective view of a component mounting device of the component mounter.

Component mounting device 24 is arranged on beam 42, and includes two work heads 60 and 62 and work head moving device 64. Each of work heads 60 and 62 include suction nozzle (refer to FIG. 2) 66, and the parts are held by suction nozzle 66. Further, work head moving device 64 included X-direction moving device 68, Y-direction moving device 70, and Z-direction moving device 72. Two work heads 60 and 62 are integrally moved to any position on frame 40 by X-direction moving device 68 and Y-direction moving device 70. Further, as shown in FIG. 2, each of work heads 60 and 62 are detachably attached to sliders 74 and 76, and Z-direction moving device 72 individually moves sliders 74 and 76 in the up-down direction. That is, work heads 60 and 62 are individually moved in the up-down direction by Z-direction moving device 72.

Imaging device 26 is attached to slider 74 in a state of facing downward, and is moved to the X-direction, Y-direction, and Z-direction together with the work head 60. As a result, imaging device 26 images any positions on frame 40. As shown in FIG. 1, imaging device 28 is arranged between base material conveyance holding device 22 on frame 40 and parts supply apparatus 30 in a state of facing upward. As a result, imaging device 28 images the parts held by suction nozzles 66 of work heads 60 and 62.

Parts supply apparatus 30 is arranged at the first end portion of frame 40 in the front-rear direction. Parts supply apparatus 30 includes tray type parts supply apparatus 78 and feeder type parts supply apparatus (not illustrated). Tray type parts supply apparatus 78 is an apparatus that supplies the parts in a state of being placed on the tray. The feeder type parts supply apparatus is a device that supplies the parts by a tape feeder (not illustrated) and a stick feeder (not illustrated).

Bulk parts supply apparatus 32 is arranged at the second end portion of frame 40 in the front-rear direction. Bulk parts supply apparatus 32 is an apparatus that aligns the scattered multiple parts and supplies the parts in the aligned state. That is, the bulk parts supply apparatus is an apparatus that aligns the multiple parts in any posture to a predetermined posture, and supplies the parts of the predetermined posture. The configuration of parts supply apparatus 32 will be described in detail below. Examples of the parts supplied by parts supply apparatus 30 and bulk parts supply apparatus 32 include electronic circuit parts, configuration parts of a solar cell, configuration parts of a power module, and the like. Further, the electronic circuit parts include parts with leads and parts without leads.

Figure 3:
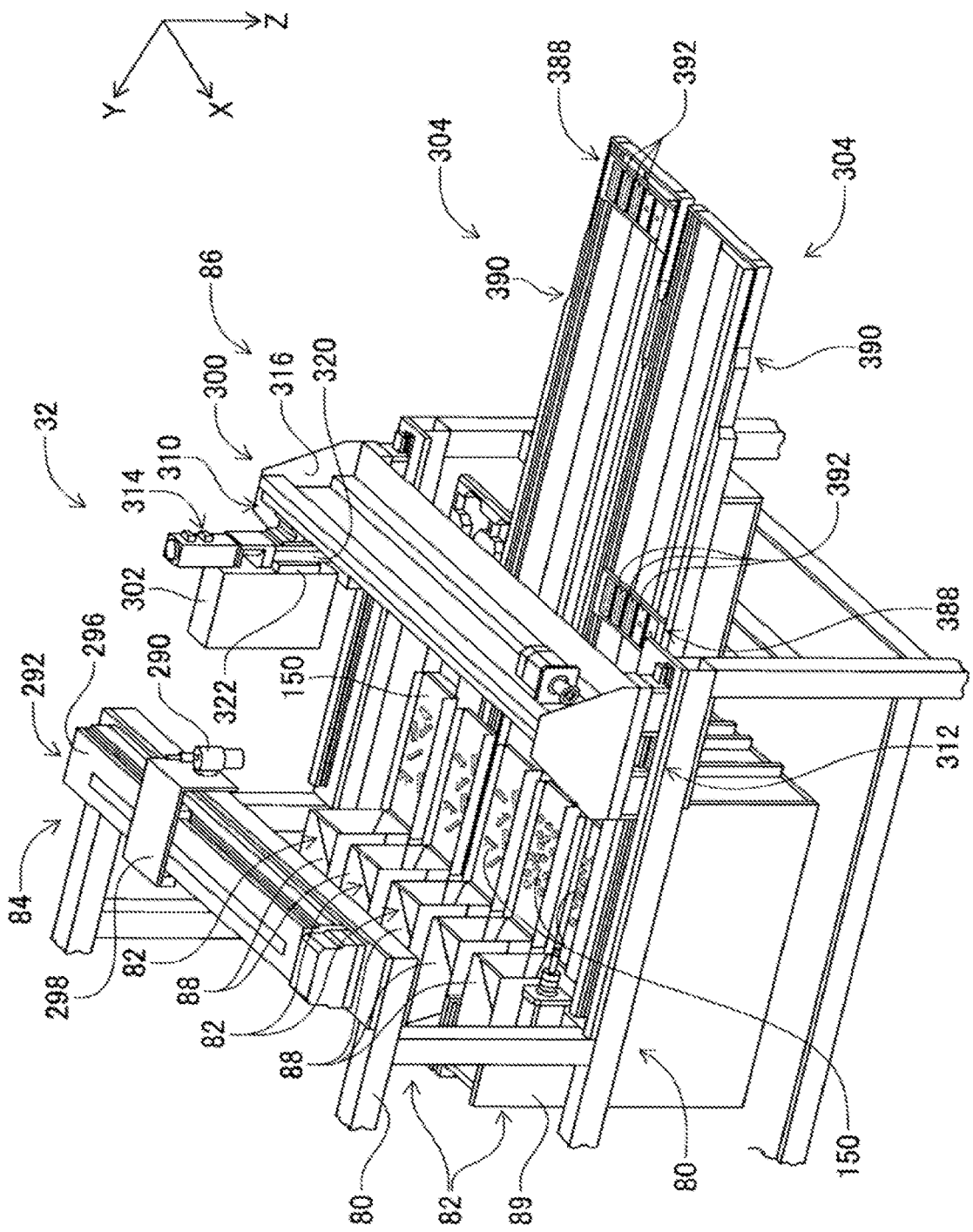
FIG. 3 is a perspective view of bulk parts supply apparatus.

As shown in FIG. 3, bulk parts supply apparatus 32 includes main body 80, parts supply unit 82, two-dimensional imaging device 84, and parts delivery device 86.

(a) Parts Supply Unit

Parts supply unit 82 includes parts supplier 88, frame 89, parts scattering device (refer to FIG. 4) 90, and parts return device (refer to FIG. 4) 92, and parts supplier 88, frame 89, is a unit in which parts scattering device 90, and parts return device 92 are integrally configured. Parts supply unit 82 is detachably assembled to main body 80.

Figure 4:
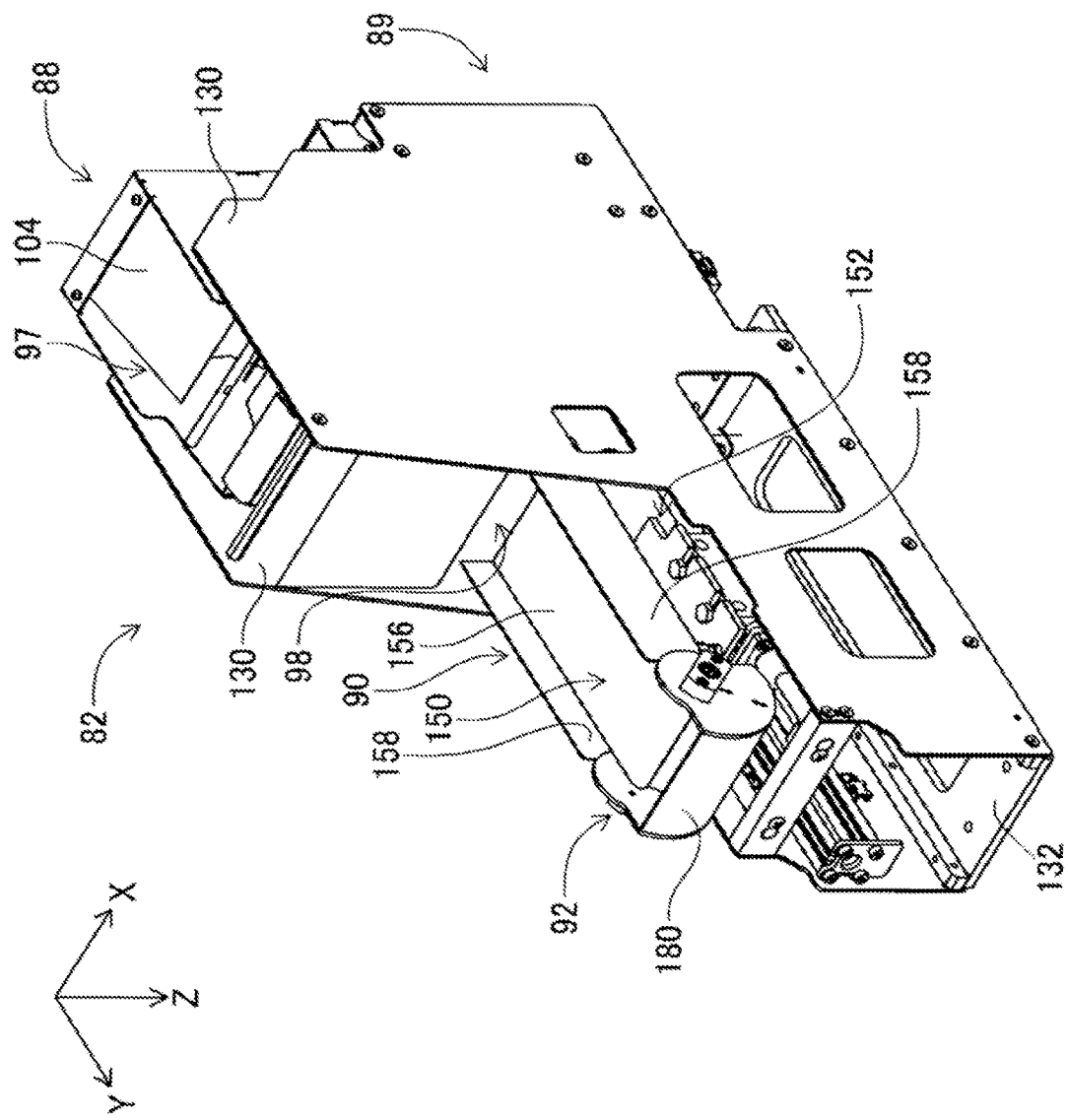
FIG. 4 is a perspective view of a parts supply unit.
Figure 5:
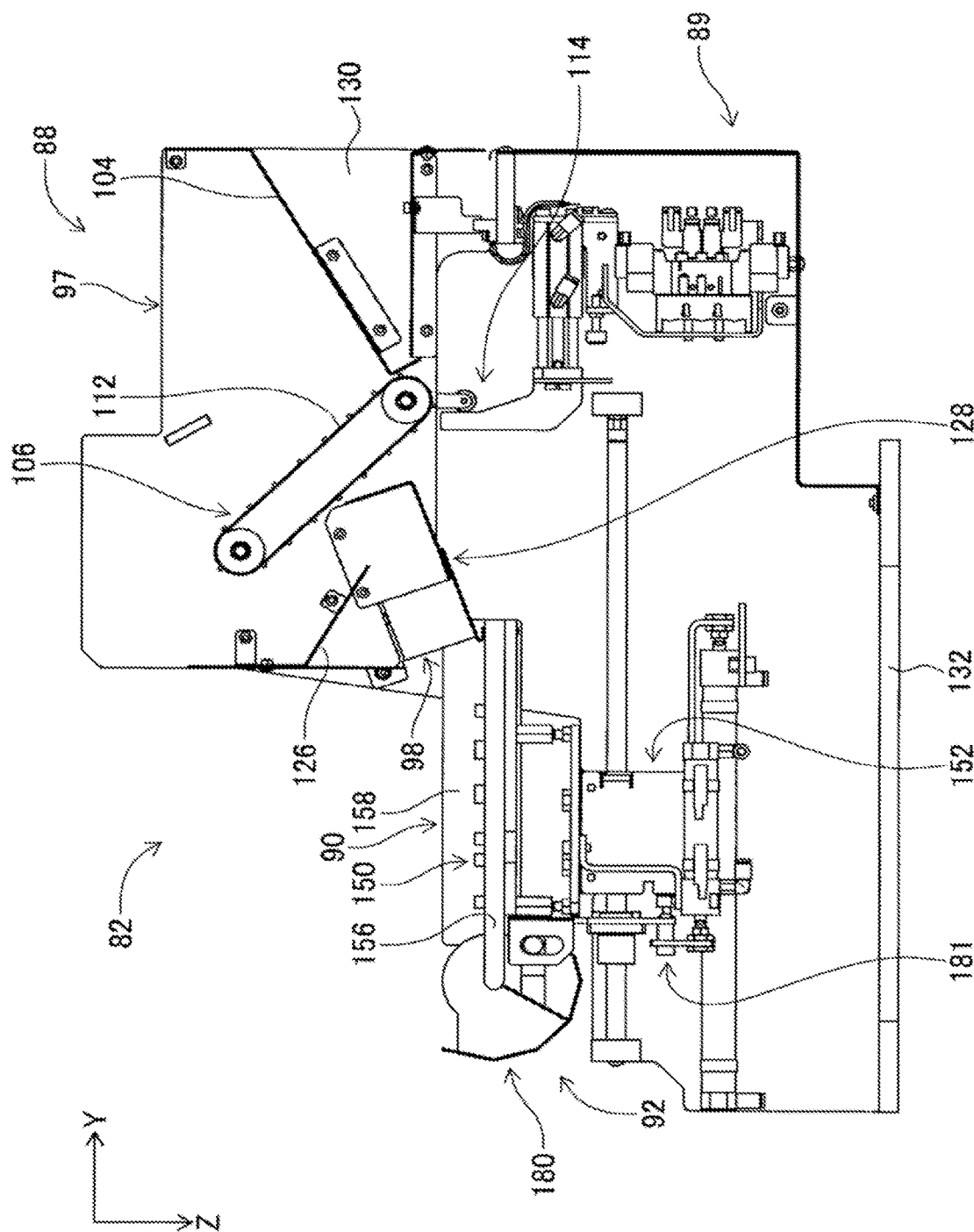
FIG. 5 is a transparent view of the parts supply unit.

Parts supplier 88 generally has a rectangular parallelepiped box shape, and is arranged so as to extend in the Y-direction as shown in FIG. 4 and FIG. 5. The Y-direction will be described as the front-rear direction of parts supplier 88, the direction toward the side where parts return device 92 is arranged in parts supply unit 82 is described as a front direction, and the direction toward the side where parts supplier 88 is arranged will be described as a rear direction.

Parts supplier 88 has openings at the upper surface and the front surface, and the opening at the upper surface is parts input port 97, and the opening at the front surface is parts discharge port 98. In parts supplier 88, inclined plate 104 is arranged below input port 97. The inclined plate 104 is arranged so as to be inclined so as to be inclined downward from the end surface on the rear side of parts supplier 88 toward the center direction.

Further, as shown in FIG. 5, conveyor device 106 is arranged on the front side of inclined plate 104. Conveyor device 106 is arranged so as to be inclined upward from the front side end portion of inclined plate 104 toward the front direction of parts supplier 88. Conveyor belt 112 of conveyor device 106 is driven by electromagnetic motor (refer to FIG. 12) 116 to rotate counterclockwise in FIG. 5. That is, the conveyance direction by conveyor device 106 is the diagonally upward direction from the front end portion of inclined plate 104 toward the front direction.

Further, inclined plate 126 is arranged below the front side end portion of conveyor device 106. Inclined plate 126 is arranged toward the lower side of the conveyor device 106 from the end surface on the front side of parts supplier 88, and the end portion on the rear side is inclined diagonally downward. Furthermore, inclined plate 128 is also arranged below inclined plate 126. Inclined plate 128 is inclined toward discharge port 98 of parts supplier 88 from below the center portion of conveyor device 106 such that the front side end portion is positioned below.

Further, as shown in FIG. 4, frame 89 is configured with a pair of side frames 130 and connecting frame 132. The pair of side frames 130 are erected so as to be parallel to each other and extend in the Y-direction in a state of facing each other. Connecting frame 132 is bridged to the lower end of a pair of side frames 130, and the pair of side frames 130 are connected by connecting frame 132. Frame 89 functions as a housing of parts supply unit 82, but may be a reinforcing member, an outer shell member, a housing, a cover, a casing, or the like of parts supply unit 82 without functioning as the housing. Further, a distance between the pair of side frames 130 is slightly larger than the width direction dimension of parts supplier 88, and parts supplier 88 is attached between the pair of side frames 130 in a detachable manner with one-touch in a state of being positioned. Detachable with one-touch means that the operator can reproducibly attach and detach without using a tool or the like.

Figure 6:
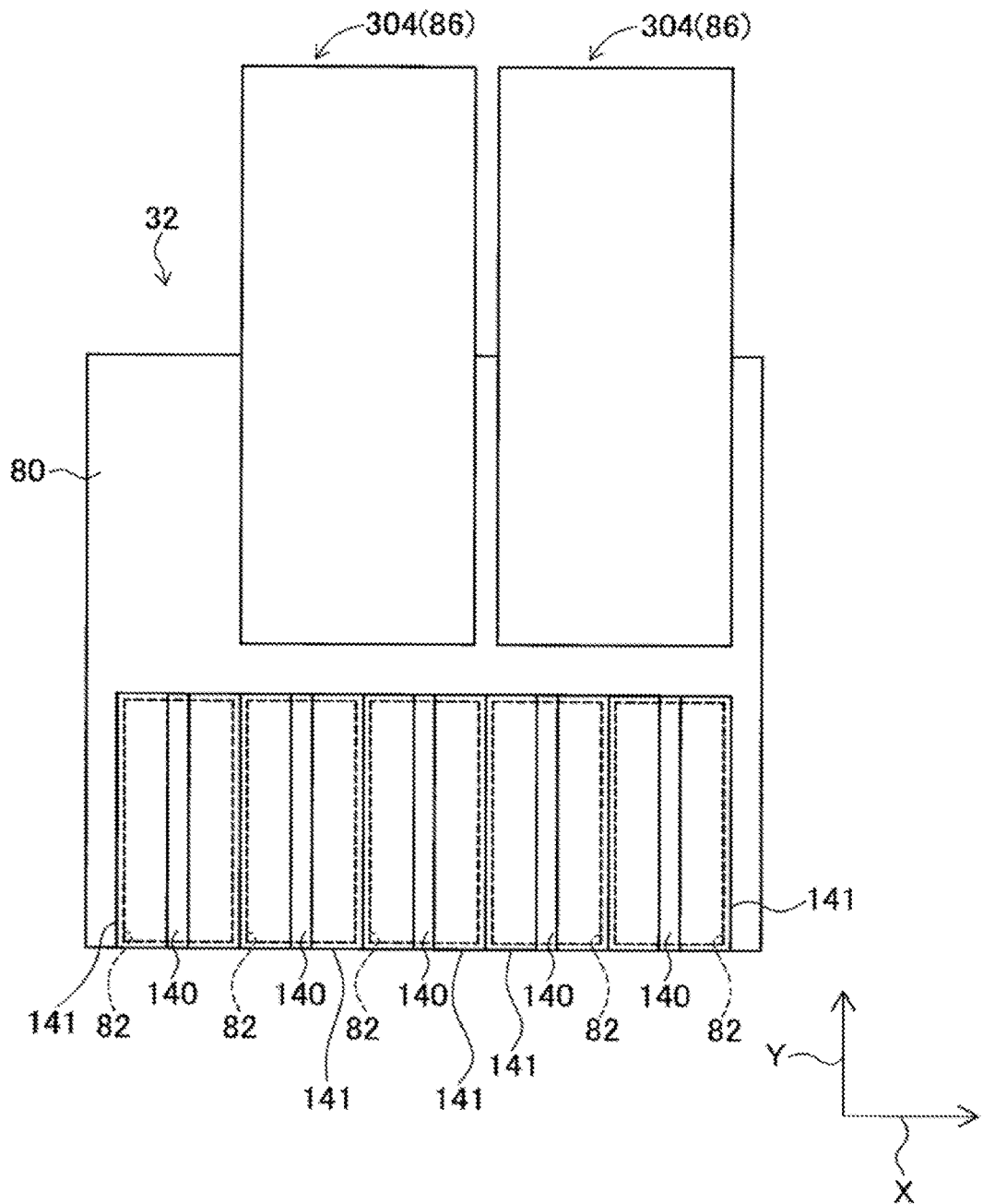
FIG. 6 is a plan view of a main body of the bulk parts supply apparatus.

Further, as shown in FIG. 6, five slots 140 are formed on the upper surface of main body 80 of bulk parts supply apparatus 32. Each slot 140 is formed so as to extend in the Y-direction, and five slots 140 are adjacent to each other in the X-direction at the same pitch. These five slots 140 have the same shape. The dimension of each slot 140 in the X-direction, that is, the width direction dimension is smaller than the width dimension of frame 89 of parts supply unit 82. Further, the dimension of each slot 140 in the Y-direction, that is, the length dimension is slightly larger than the length dimension of frame 89 of parts supply unit 82. Frame 89 of parts supply unit 82 is bolted on each slot 140. As a result, parts supply unit 82 can be attached and detached in a state of being positioned in unit mounting area 141 corresponding to each slot by using each slot 140 of main body 80 by the operator using a tool. By the way, slot 140 may be detachable by reproducing parts supply unit 82 in a positioned state, parts supply unit 82 can be attached adjacent to each other by using each slot 140.

In bulk parts supply apparatus 32 shown in FIG. 3, five parts supply units 82 are attached to five slots 140. Therefore, five parts supply units 82 are attached in a state of being adjacent to five slots 140 on the upper surface of main body 80 of bulk parts supply apparatus 32. The state of being adjacent means a concept including a state in which there is a slight clearance between adjacent parts supply units 82 even if the adjacent parts supply units 82 are not in contact with each other. Although there is a slight clearance, parts supply units 82 are arranged without any gap therebetween.

Further, as shown in FIG. 4 and FIG. 5, parts scattering device 90 includes parts support member 150 and parts support member moving device 152. Parts support member 150 is configured with stage 156 and a pair of side wall portions 158. Stage 156 has a generally elongated plate shape, and is arranged so as to extend in the front direction from below parts supplier 88 attached between the pair of side frames 130. Further, the width dimension of stage 156 is approximately the same as the dimension between the pair of side frames 130, that is, the width dimension of frame 89, and the rear end portion of stage 156 is positioned between the pair of side frames 130. The upper surface of stage 156 is generally horizontal, and as shown in FIG. 5, the rear end portion is arranged with a state in which there is a slight clearance from the front end portion of inclined plate 128 of parts supplier 88. Further, as shown in FIG. 4, a pair of side wall portions 158 is fixed in a state of being erected on both sides in the longitudinal direction of stage 156, and the upper end of each side wall portion 158 extends above the upper surface of stage 156.

Figure 7:
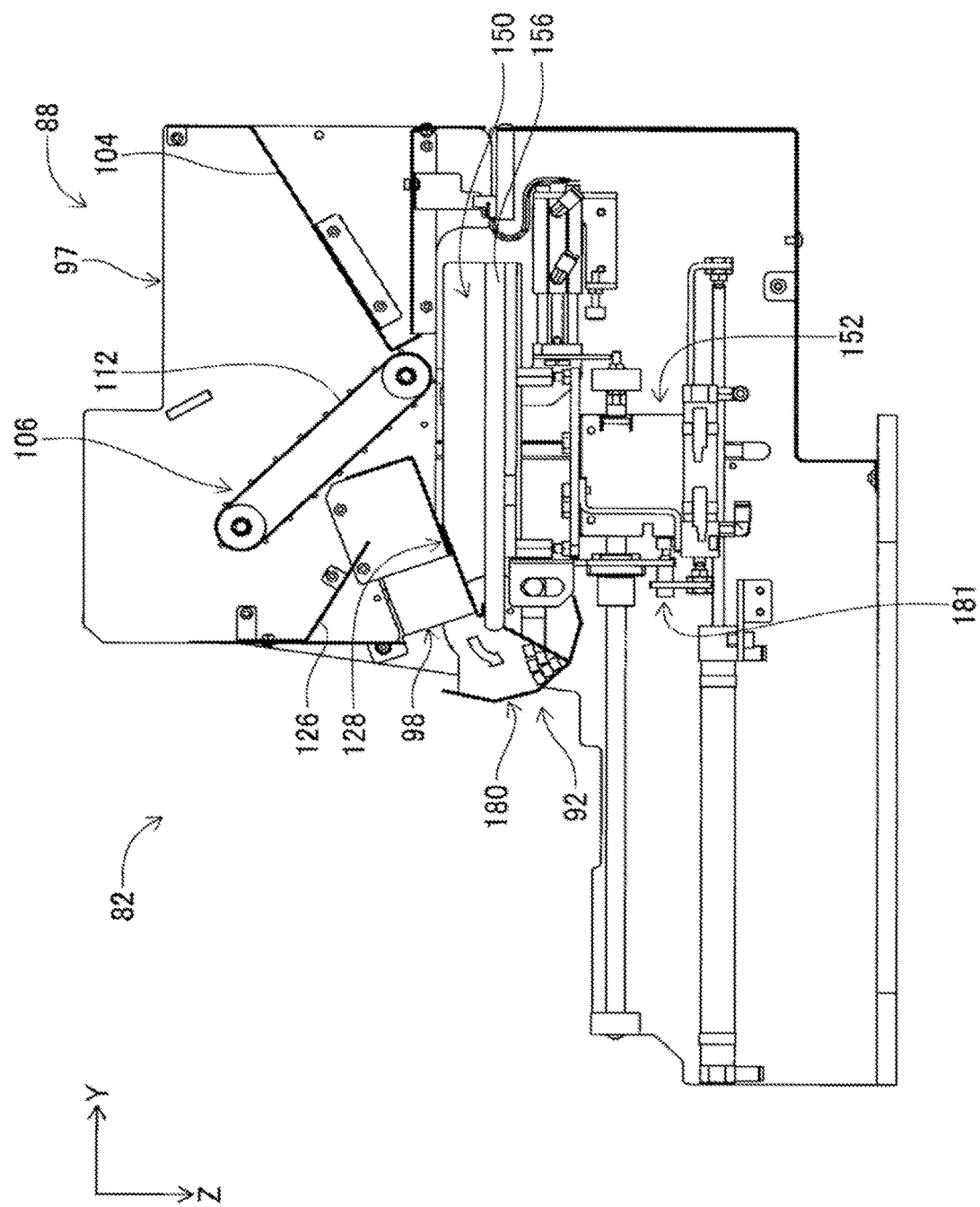
FIG. 7 is a transparent view of the parts supply unit.

Further, parts support member moving device 152 slides parts support member 150 in the Y-direction by the operation of air cylinder (refer to FIG. 12) 166. At this time, parts support member 150 moves between a stored state which is a state of being stored below parts supplier 88 (refer to FIG. 7) and an exposed state which is a state of being exposed from below parts supplier 88 (refer to FIG. 5).

Figure 8:
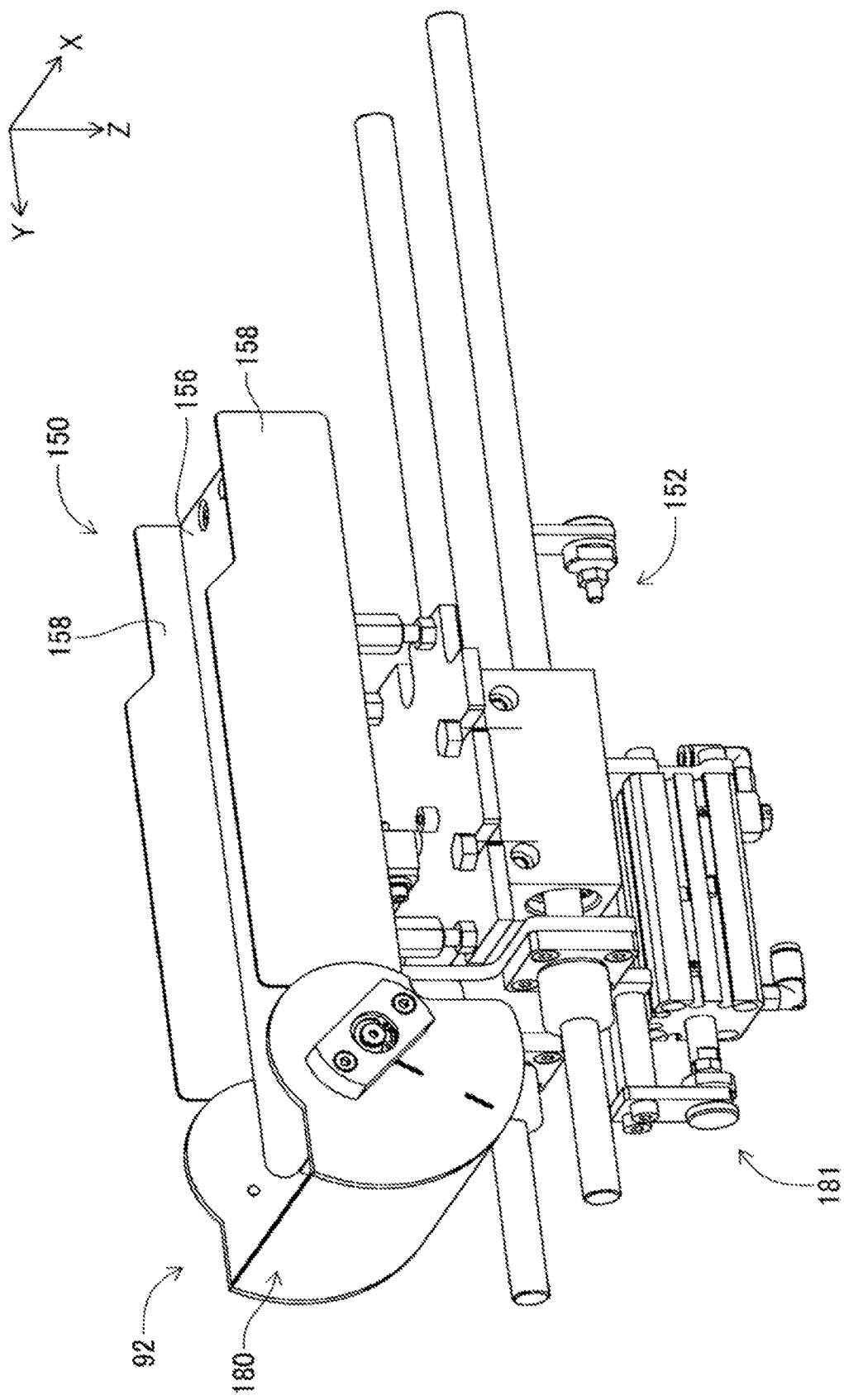
FIG. 8 is a perspective view of a parts scattering device.
Figure 9:
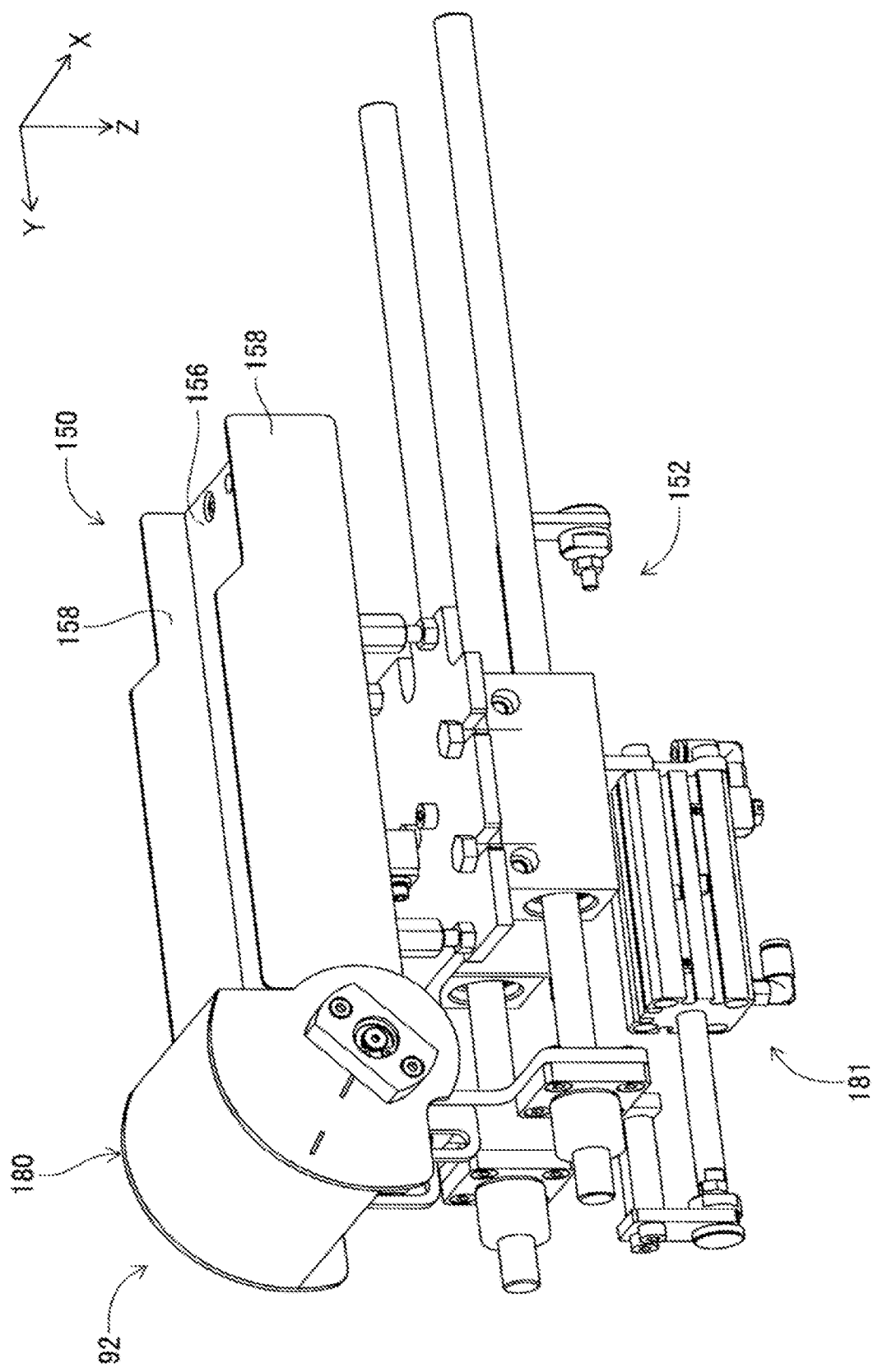
FIG. 9 is a perspective view of the parts scattering device.

As shown in FIG. 8, parts return device 92 includes parts accommodating container 180 and container swinging device 181. Parts accommodating container 180 has a generally box-like shape and an arc-shaped bottom surface. The width dimension of the parts accommodating container 180 is approximately the same as the width dimension of stage 156. Parts accommodating container 180 is held so as to be swingable at the front side end portion of stage 156, and swings by the operation of container swinging device 181. At this time, parts accommodating container 180 swings between an accommodating posture in which the opening is facing upward (refer to FIG. 8) and a returning posture in which the opening is facing the upper surface of stage 156 of parts support member 150 (refer to FIG. 9).

(b) Two-Dimensional Imaging Device

As shown in FIG. 3, two-dimensional imaging device 84 includes camera 290 and camera moving device 292. Camera moving device 292 includes guide rail 296 and slider 298. Guide rail 296 is fixed to main body 80 above parts supplier 88 so as to extend in the width direction (X-direction) of bulk parts supply apparatus 32. Slider 298 is slidably attached to guide rail 296 and slides to any position by the operation of electromagnetic motor (refer to FIG. 12) 299. Further, camera 290 is attached to slider 298 in a state of facing downward.

(c) Parts Delivery Device

As shown in FIG. 3, parts delivery device 86 includes parts holding head moving device 300, parts holding head 302, and two shuttle devices 304.

Parts holding head moving device 300 includes X-direction moving device 310, Y-direction moving device 312, and Z-direction moving device 314. Y-direction moving device 312 includes Y-slider 316 arranged above parts supply unit 82 so as to extend in the X-direction, and Y-slider 316 moves to any position in the Y-direction by the driving of electromagnetic motor (refer to FIG. 12) 319. X-direction moving device 310 includes X-slider 320 arranged on the side surface of Y-slider 316, and X-slider 320 moves to any position in the X-direction by the driving of electromagnetic motor (refer to FIG. 12) 321. Z-direction moving device 314 includes Z-slider 322 arranged on the side surface of X-slider 320, and Z-slider 322 moves to any position in the Z-direction by the driving of electromagnetic motor (refer to FIG. 12) 323.

Figure 10:
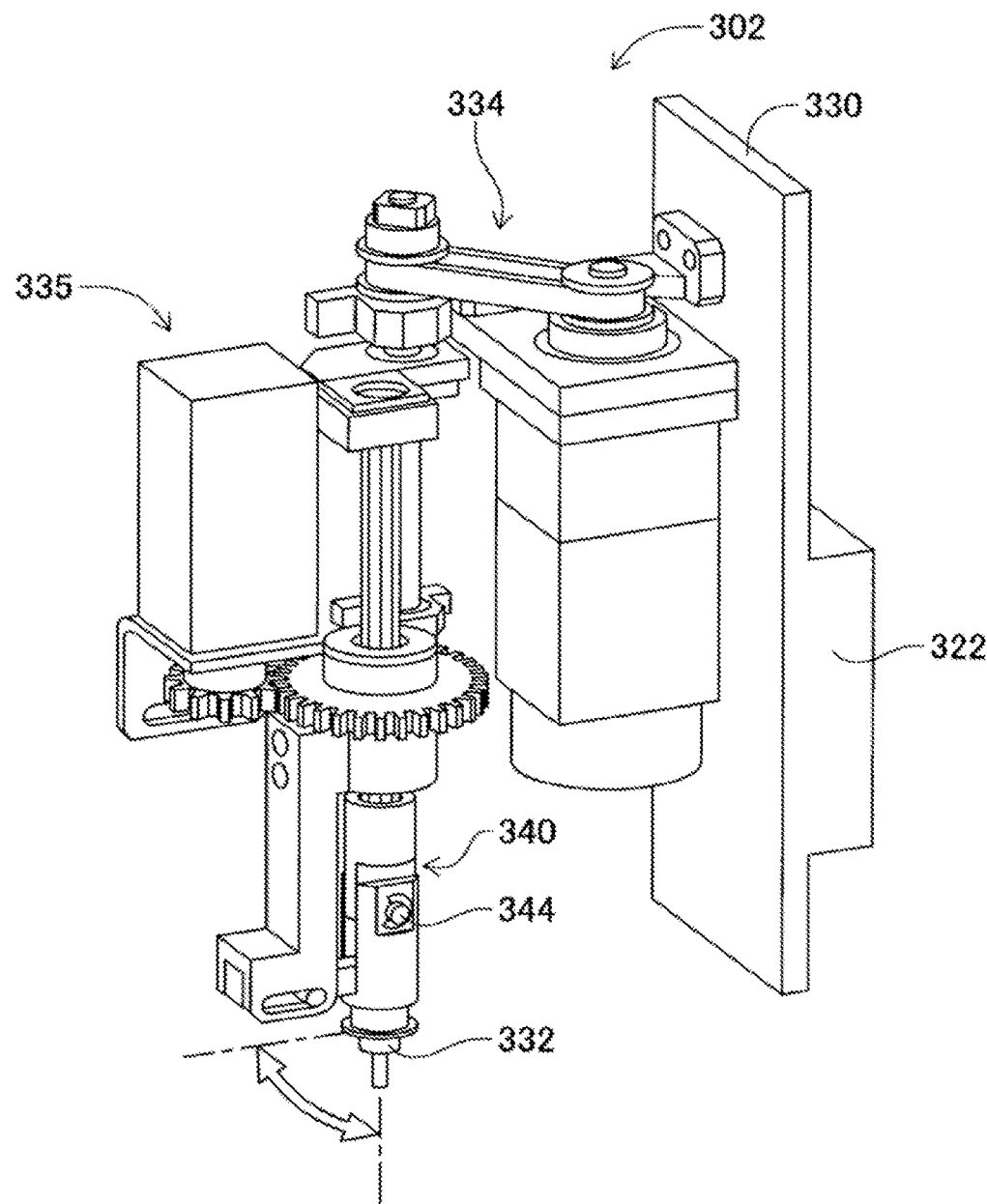
FIG. 10 is a perspective view of a parts holding head.

As shown in FIG. 10, parts holding head 302 includes head main body 330, suction nozzle 332, nozzle pivoting device 334, and nozzle rotation device 335. Head main body 330 is formed integrally with Z-slider 322. Suction nozzle 332 holds the parts and is detachably attached to the lower end portion of holder 340. Holder 340 is bendable at support shaft 344, and holder 340 is bent 90 degrees upward by the operation of nozzle pivoting device 334. Thus, suction nozzle 332 which is attached to the lower end portion of holder 340 is pivoted 90 degrees and is positioned at the pivoted position. That is, suction nozzle 332 pivots between a non-pivoted position and a pivoted position by the operation of nozzle pivoting device 334. Of course, it is also possible to fix a position with an angle between the non-pivoted position and the pivoted position. Nozzle rotation device 335 also rotates suction nozzle 332 around the axial center.

Further, as shown in FIG. 3, each of two shuttle devices 304 includes parts carrier 388 and parts carrier moving device 390, and is fixed to the main body 80 side by side in the lateral direction on the front side of the parts supply unit 82. Five parts receiving members 392 which are arranged side by side in a row in the lateral direction are attached to parts carrier 388, and the parts are placed on each parts receiving members 392.

Figure 11:
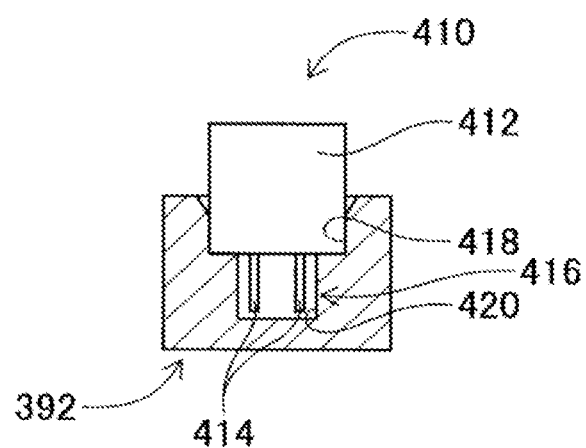
FIG. 11 is a diagram showing a parts receiving member in a state in which electronic circuit parts are received.

Bulk parts supply apparatus 32 can supply various parts, and various parts receiving member 392 are prepared according to the shape of the parts. Here, as shown in FIG. 11, as the electronic circuit parts supplied by bulk parts supply apparatus 32, parts receiving member 392 corresponding to lead parts 410 having the leads will be described. Lead parts 410 are configured with block-shaped parts main body 412 and two leads 414 protruding from the bottom surface of parts main body 412.

Further, parts receiving member 392 is formed with parts accommodation recess portion 416 having a shape corresponding to lead parts 410. Parts accommodation recess portion 416 is a recess portion having a stepped shape, and is configured with main body accommodation recess portion 418 that opens on the upper surface of parts receiving member 392 and lead accommodation recess portion 420 that opens on the bottom surface of main body accommodation recess portion 418. Lead parts 410 are inserted into parts accommodation recess portion 416 in a posture in which leads 414 faces downward. As a result, lead 414 is inserted into lead accommodation recess portion 420, and lead parts 410 is placed inside of parts accommodation recess portion 416 in a state in which parts main body 412 is inserted into main body accommodation recess portion 418.

Further, as shown in FIG. 3, parts carrier moving device 390 is a plate-shaped elongated member, and is arranged on the front side of parts supply unit 82 so as to extend in the front-rear direction. On the upper surface of parts carrier moving device 390, parts carrier 388 is slidably arranged in the front-rear direction, and slides to any position in the front-rear direction by the driving of electromagnetic motor (refer to FIG. 12) 430. When parts carrier 388 slides in the direction approaching parts supply unit 82, parts carrier 388 slides up to a parts receiving position positioned within a moving range of parts holding head 302 by parts holding head moving device 300. On the other hand, when parts carrier 388 slides in the direction away from parts supply unit 82, parts carrier 388 slides up to a parts supply position positioned within the moving range of work heads 60 and 62 by work head moving device 64.

Figure 12:
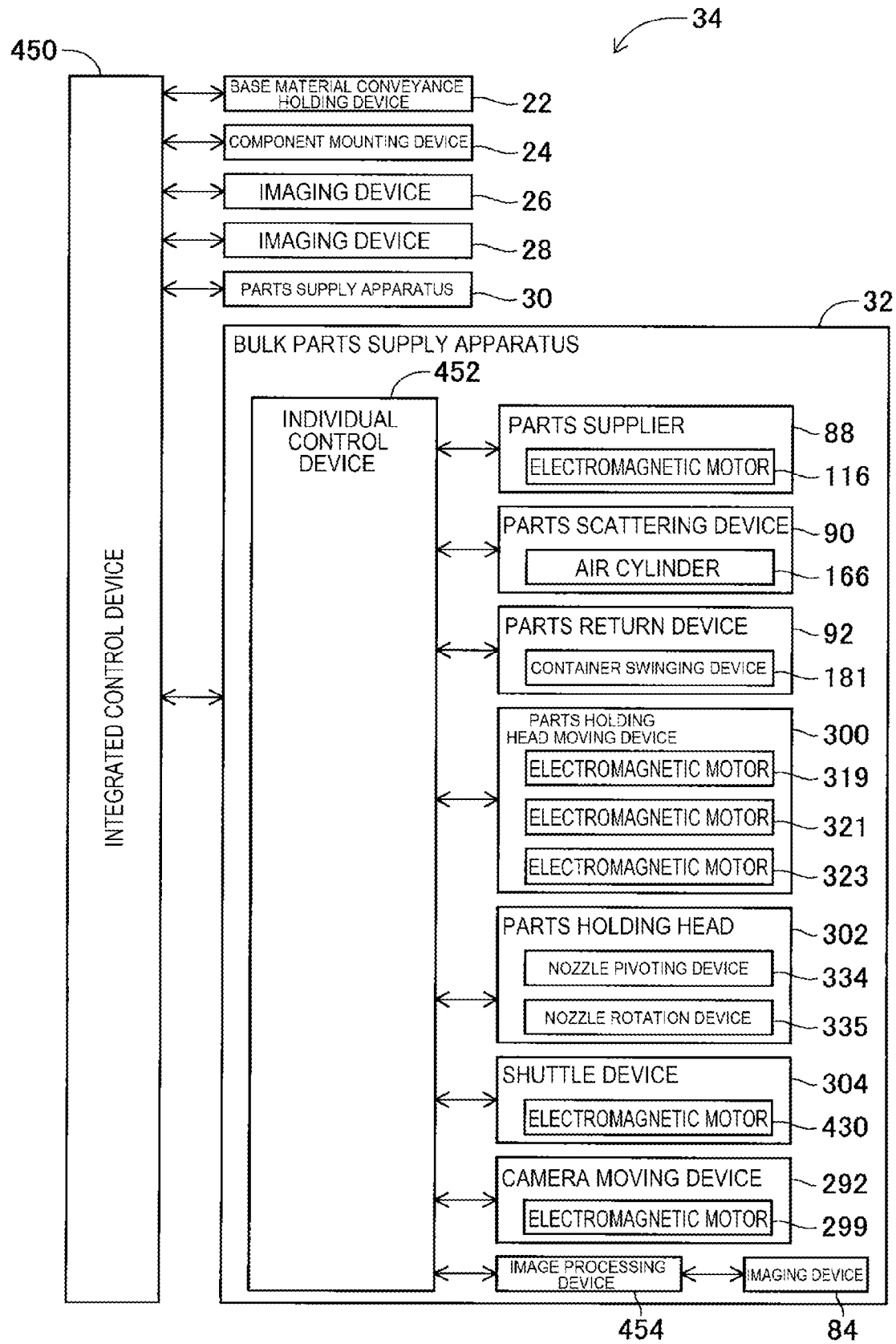
FIG. 12 is a block diagram showing a control device of the component mounter.

Further, as shown in FIG. 12, control device 34 includes integrated control device 450, multiple individual control devices (only one is shown in the FIG. 452, and image processing device 454. Integrated control device 450 is configured mainly with a computer, and is connected to base material conveyance holding device 22, component mounting device 24, imaging device 26, imaging device 28, parts supply apparatus 30, and bulk parts supply apparatus 32. As a result, integrated control device 450 integrally controls base material conveyance holding device 22, component mounting device 24, imaging device 26, imaging device 28, parts supply apparatus 30, and bulk parts supply apparatus 32. Multiple individual control devices 452 are configured mainly with a computer, and are provided corresponding with base material conveyance holding device 22, component mounting device 24, imaging device 26, imaging device 28, parts supply apparatus 30, and bulk parts supply apparatus 32 (in the figure, only individual control device 452 corresponding to bulk parts supply apparatus 32 is shown).

Individual control device 452 of bulk parts supply apparatus 32 is connected to parts supplier 88, parts scattering device 90, parts return device 92, camera moving device 292, parts holding head moving device 300, parts holding head 302, and shuttle device 304. As a result, individual control device 452 of bulk parts supply apparatus 32 controls parts supplier 88, parts scattering device 90, parts return device 92, camera moving device 292, parts holding head moving device 300, parts holding head 302, and shuttle device 304. Further, image processing device 454 is connected to two-dimensional imaging device 84, and processes the image data imaged by two-dimensional imaging device 84. Image processing device 454 is connected to individual control device 452 of bulk parts supply apparatus 32. As a result, individual control device 452 of bulk parts supply apparatus 32 acquires the image data imaged by two-dimensional imaging device 84.

(B) Operation of Component Mounter

With the configuration described above, component mounter 10 performs component mounting work on circuit base material 12 held in base material conveyance holding device 22. Specifically, circuit base material 12 is conveyed to the working position by base material conveyance holding device 22, and is fixedly held by clamping device 52 at that position. Next, imaging device 26 moves above the fixedly held circuit base material 12 and images circuit base material 12. As a result, information on the error of the holding position of circuit base material 12 can be obtained. Further, parts supply apparatus 30 or bulk parts supply apparatus 32 supplies the parts at a predetermined supply position. The supply of the parts by bulk parts supply apparatus 32 will be described in detail later. One of work heads 60 and 62 moves above supply position of the parts and holds the parts by suction nozzle 66. Subsequently, work heads 60 and 62 holding the parts are moved above imaging device 28, and the parts held by suction nozzle 66 are imaged by imaging device 28. As a result, the information on the error of the holding position of the parts can be obtained. Then, work heads 60 and 62 holding the parts move above circuit base material 12, and mount the holding parts on circuit base material 12 after correcting the error of the holding position of circuit base material 12, the error of the holding position of the parts, and the like.

(C) Operation of Bulk Parts Supply Apparatus

In bulk parts supply apparatus 32, lead parts 410 are input by the operator from input port 97 of parts supplier 88, and the input lead parts 410 are supplied in a state of being placed on parts receiving member 392 of parts carrier 388 by the operation of parts supply unit 82 and parts delivery device 86.

Specifically, the operator inputs lead parts 410 from input port 97 of upper surface of parts supplier 88. At this time, parts support member 150 is moved below parts supplier 88 by the operation of parts support member moving device 152, and is in the stored state (refer to FIG. 7). When parts support member 150 is in the stored state, parts accommodating container 180 arranged at the end portion of the front side of parts support member 150 is positioned in the front direction of parts supplier 88, and has a posture (accommodating posture) in which the opening of parts accommodating container 180 is facing upward.

Lead parts 410 input from input port 97 of parts supplier 88 falls on inclined plate 104 of parts supplier 88 and rolls down to the lower end of the front side of inclined plate 104. At this time, lead parts 410 that rolled down to the lower end on the front side of inclined plate 104 are accumulated between the lower end on the front side of inclined plate 104 and the lower end on the rear side of conveyor device 106. Then, when conveyor device 106 is operated, conveyor belt 112 of conveyor device 106 circulates counterclockwise in FIG. 7. At this time, lead parts 410 accumulated between inclined plate 104 and conveyor belt 112 are conveyed diagonally upward by conveyor belt 112.

Then, lead parts 410 conveyed by conveyor belt 112 fall onto inclined plate 126 from the upper end of the front side of conveyor device 106. Lead parts 410 fell onto inclined plate 126 roll down on inclined plate 126 toward the rear direction and fall on inclined plate 128. Lead parts 410 fell onto inclined plate 128 roll down toward the front direction and are discharged from discharge port 98 on the front side of parts supplier 88.

As a result, lead parts 410 discharged from discharge port 98 of parts supplier 88 are accommodated inside parts accommodating container 180. When a predetermined amount of lead parts 410 is discharged from parts supplier 88, that is, when conveyor device 106 operates in a certain amount, conveyor device 106 stops. Next, parts support member 150 moves from the stored state toward the front direction by the operation of parts support member moving device 152.

Then, at the timing when parts support member 150 moves a predetermined amount toward the exposed state in the front direction from the stored state, container swinging device 181 of parts return device 92 is operated, and parts accommodating container 180 swings. As a result, the posture of parts accommodating container 180 vigorously changes from the posture with the opening facing upward (accommodating posture) to the posture with opening facing stage 156 (returning posture). At this time, lead parts 410 accommodated in parts accommodating container 180 are vigorously released toward stage 156. As a result, lead parts 410 are scattered on stage 156 from parts accommodating container 180. The scattering of lead parts 410 is a concept including a state in which lead parts 410 are scattered in an overlapping state and a state in which lead parts 410 are scattered in a separated state without overlapping.

Figure 13:
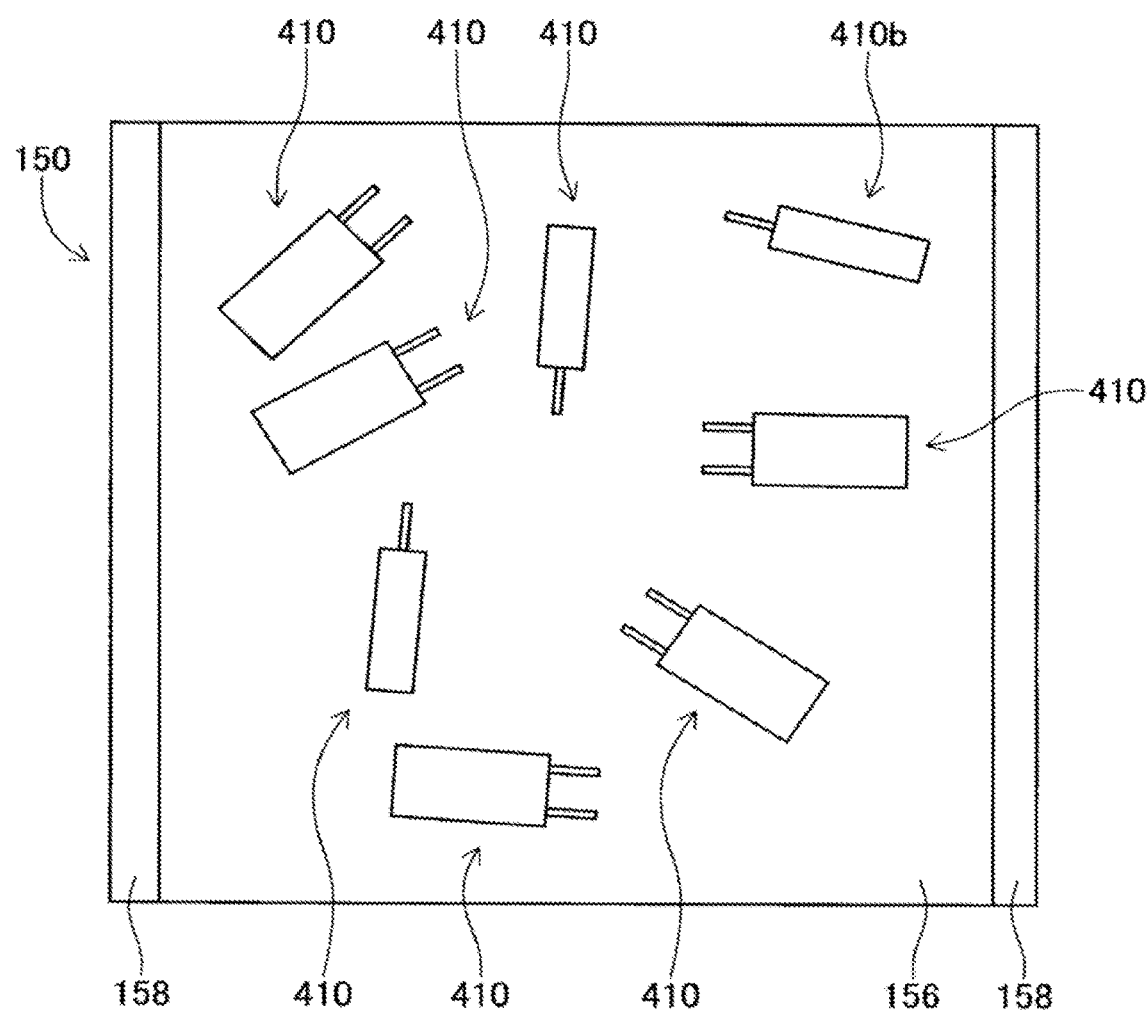
FIG. 13 is a diagram showing a parts support member in a state in which lead parts are scattered from the viewpoint from above.

When lead parts 410 are scattered on stage 156 of parts support member 150 from parts supplier 88 according to the procedure described above, camera 290 of two-dimensional imaging device 84 moves above parts support member 150 by the operation of camera moving device 292, and images lead parts 410. As a result, as shown in FIG. 13, two-dimensional image data of each of multiple lead parts 410 scattered on upper surface of parts support member 150 is obtained. Then, for multiple lead parts 410 scattered on the upper surface of parts support member 150, information such as the position on parts support member 150 and the posture of lead parts 410 are calculated based on the two-dimensional image data.

Then, parts holding head 302 is moved above the lead parts by the operation of parts holding head moving device 300 based on the calculated information on the position of lead parts 410 and the like, and the lead parts are picked up and held by suction nozzle 332. When the lead parts are picked up and held by suction nozzle 332, suction nozzle 332 is positioned at the non-pivoted position.

Then, after lead parts 410 are held by suction nozzle 332, parts holding head 302 moves above parts carrier 388. At this time, parts carrier 388 is moved to a parts receiving position by the operation of parts carrier moving device 390. Further, when parts holding head 302 moves above parts carrier 388, suction nozzle 332 is pivoted to the pivoted position. Suction nozzle 332 is pivoted by the operation of nozzle rotation device 335 such that leads 414 of lead parts 410 held by suction nozzle 332 at the pivoted position faces downward in the vertical direction.

When parts holding head 302 moves above parts carrier 388, lead parts 410 in a state in which lead 414 faces downward in the vertical direction are inserted into parts accommodation recess portion 416 of parts receiving member 392. As a result, as shown in FIG. 11, lead parts 410 are placed on parts receiving member 392 in a state in which lead 414 faces downward in the vertical direction.

Then, when lead parts 410 are placed on parts receiving member 392, parts carrier 388 moves to a parts supply position by the operation of parts carrier moving device 390. Since parts carrier 388 moved to the parts supply position is positioned at the moving range of work heads 60 and 62, in bulk parts supply apparatus 32, lead parts 410 are supplied to component mounter 10 at this position. In this way, in bulk parts supply apparatus 32, in component receiving member 392, lead parts 410 are supplied in a state in which leads 414 faces downward and the upper surface facing the bottom surface to which leads 414 are connected is facing upward. Therefore, suction nozzles 66 of work heads 60 and 62 can appropriately hold lead parts 410.

(D) Exchange of Parts Supply Unit

Figure 14:
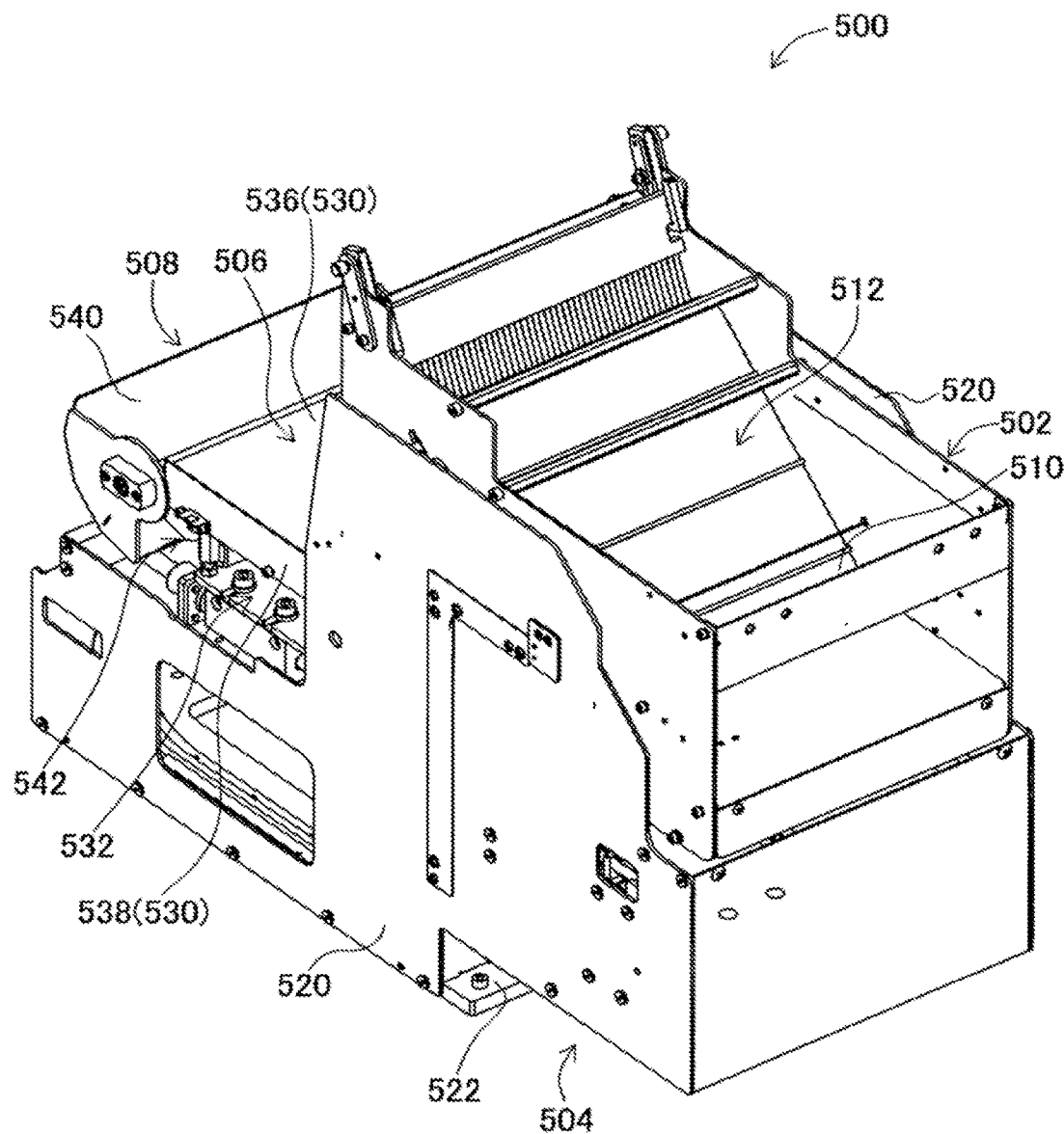
FIG. 14 is a perspective view of a wide parts supply unit.

Further, in bulk parts supply apparatus 32, parts supply unit (refer to FIG. 14) 500 which is wider than parts supply unit 82, is also prepared, and that wide parts supply unit 500 can be attached to slot 140 of main body 80 instead of parts supply unit 82.

Specifically, wide parts supply unit 500 includes parts supplier 502, frame 504, parts scattering device 506, and parts return device 508, similar to parts supply unit 82. Since wide parts supply unit 500 is substantially the same as parts supply unit 82 except that the width is wider than that of parts supply unit 82, the description will be simplified.

Parts supplier 502 has a box shape in which parts supplier 88 of parts supply unit 82 is doubled in the width direction. That is, the length dimension and the depth dimension of parts supplier 502 are the same as the length dimension and the depth dimension of parts supplier 88, and only the width dimension of parts supplier 502 is twice width dimension of parts supplier 88. Further, inclined plate 510, conveyor device 512, inclined plate (not illustrated), and the like are arranged inside parts supplier 502, as in parts supplier 88, however, inclined plate 510, conveyor device 512, inclined plate, and the like have shapes in which inclined plate 104, conveyor device 106, inclined plate 126, inclined plate 128, and the like arranged inside parts supplier 88 are doubled in the width direction.

Further, frame 504 also has a shape in which frame 89 of parts supply unit 82 is doubled in the width direction, and is configured with a pair of side frames 520 and connecting frame 522 similar to frame 89. The pair of side frames 520 has substantially the same shape as the pair of side frames 130 of parts supply unit 82, and connecting frame 522 has a shape in which connecting frame 132 of parts supply unit 82 is doubled in the width direction. With such a structure, parts supplier 502 having a size in which parts supplier 88 is doubled in the width direction is attached in a detachable manner with one-touch between the pair of side frames 520 in a state of being positioned. Further, frame 504 having a shape in which frame 89 of parts supply unit 82 is doubled in the width direction is mounted on two adjacent slots 140 out of five slots 140 formed in main body 80 of bulk parts supply apparatus 32. That is, when the width of parts supply unit 82 is used as the reference width, in other words, as a unit width, the width of parts supply unit 500 is twice the unit width, and frame 89 of parts supply unit 82 is bolted using one slot 140, while frame 504 of parts supply unit 500 is bolted using two adjacent slots 140. Further, positioning may be performed using only one slot without using two slots.

Further, similarly to parts scattering device 90 of parts supply unit 82, parts scattering device 506 also includes parts support member 530 and parts support member moving device 532, and parts support member 530 is configured with stage 536 and a pair of side wall portions (only one is shown in the FIG. 538. Stage 536 has a shape in which stage 156 of parts supply unit 82 is doubled in the width direction, and a pair of side wall portions 538 is erected on both edges of stage 536 in the width direction. Parts support member 530 slides in the front-rear direction by the operation of parts support member moving device 532.

Further, similarly to parts return device 92 of parts supply unit 82, parts return device 508 also includes parts accommodating container 540 and container swinging device 542. Parts accommodating container 540 has a shape in which parts accommodating container 180 of parts supply unit 82 is doubled in the width direction, and is swingably arranged at the front end of stage 536. Then, by the operation of container swinging device 542, parts accommodating container 540 swings between a posture in which the opening of parts accommodating container 540 is facing upward (accommodating posture) and a posture in which the opening of parts accommodating container 540 is facing stage 536 (returning posture).

By attaching parts supply unit 500 having such a structure to bulk parts supply apparatus 32, it becomes possible to appropriately supply the large parts. That is, parts supply unit 82 has a size of being attached to one slot 140, the width dimension of stage 156 of parts supply unit 82 is substantially the same as the unit width of parts supply unit 82. Therefore, for example, when large parts are scattered on stage 156, the large parts may overlap each other and the parts may not be supplied properly. On the other hand, wide parts supply unit 500 has a size of being attached to two slots 140, and the width dimension of stage 156 of parts supply unit 82 is approximately twice the unit width of parts supply unit 82. Therefore, even the large parts will not overlap as long as they are on wide stage 536 and will be scattered appropriately.

(E) Exchange of Parts Supplier

As described above, wide parts supply unit 500 can appropriately supply large parts. However, when wide parts supply unit 500 is attached to bulk parts supply apparatus 32, there may be a risk that the types of parts that can be supplied by bulk parts supply apparatus 32 will be reduced. Specifically, in both parts supply unit 82 and wide parts supply unit 500, one type of parts are usually supplied. That is, usually one type of parts are input to parts suppliers 88 and 502 of parts supply units 82 and 500, and one type of parts are scattered on stage 156 and stage 536. On the other hand, while two slots 140 are required to attach wide parts supply unit 500 on bulk parts supply apparatus 32, only one slot 140 is required to attach parts supply unit 82 to bulk parts supply apparatus 32. That is, in order to attach one parts supply unit 500 to bulk parts supply apparatus 32, it is necessary to remove two parts supply units 82 from the bulk parts supply apparatus 32. At this time, if two parts supply units 82 are attached to bulk parts supply apparatus 32, it is possible to supply two types of parts by two parts supply unit 82, but because only one parts supply unit 500 is attached to bulk parts supply apparatus 32, only one type of parts can be supplied. One type of parts means the parts having the same functions and the same dimensions. However, parts with different dimensions due to defective products such as differences in dimensions within tolerances and missing parts are also included in one type of parts. On the other hand, two types of parts, that is, different types of parts means the parts having different functions and different dimensions.

However, by putting two types of parts into parts supplier 502 of wide parts supply unit 500, two types of parts can be supplied by parts supply unit 500. In such a case, since two types of parts are scattered on stage 536, it is necessary to distinguish the two types of parts and hold the parts by parts holding head 302. That is, when stage 536 in which two types of parts are scattered is imaged by two-dimensional imaging device 84, the two types of parts are distinguished based on the image data obtained by imaging. Then, the parts are held by parts holding head 302 for each of the distinguished types. As described above, by inputting two types of parts into parts supplier 502 of parts supply unit 500, two types of parts can be supplied even by parts supply unit 500.

However, when two types of parts are input to parts supplier 502, specifically, when parts A and parts B are input to parts supplier 502, there is a risk that parts supply unit 500 cannot supply the required number of parts A and the parts B. That is, for example, when it is desired to supply the parts A from parts supply unit 500 in twice the number of parts B, it is desired that the parts A are scattered on stage 536 in twice the number of parts B. However, the parts A and the parts B are scattered on stage 536 at a time by one conveyor device 512 from parts supplier 502 to which the parts A and the parts B are input, it is not possible to scatter the parts A and the parts B on stage 536 by controlling the number of each parts. Therefore, even though it is desired to supply parts A from parts supply unit 500 in twice the number of parts B, sometimes the parts B may be scattered in stage 536 in twice the number of parts A. In such a case, there is a risk that the parts A cannot be supplied from parts supply unit 500 in twice the number of parts B.

Figure 15:
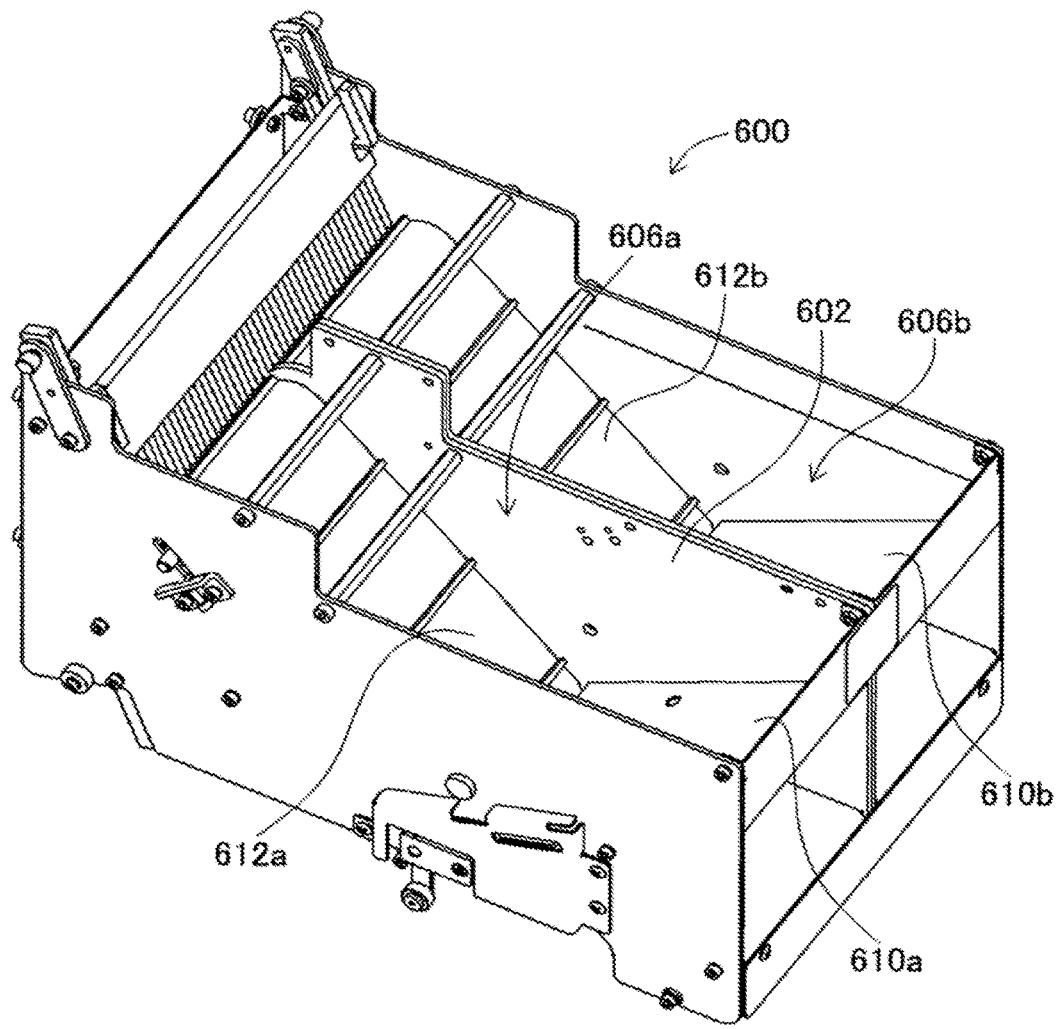
FIG. 15 is a perspective view of a parts supplier having two storages.

In view of such a situation, parts supplier 600 shown in FIG. 15 is prepared. Parts supplier 600 has a structure capable of individually accommodating two types of parts, and parts supplier 600 can be attached to parts supply unit 500 instead of parts supplier 502. As a result, it is possible to supply two types of parts from parts supply unit 500 by controlling the number of each parts.

Specifically, parts supplier 600 has the same attachment as parts supplier 502, has substantially the same shape, and has the same external dimensions. Therefore, parts supplier 600 can be attached to parts supply unit 500 instead of parts supplier 502. Further, partition plate 602 that divides the inside of parts supplier 600 into two equal parts in the width direction is arranged inside parts supplier 600. Partition plate 602 is arranged inside parts supplier 600 from the rear end to the front end so as to extend in the front-rear direction of parts supplier 600, and the inside of parts supplier 600 is partitioned into two storages 606a and 606b by partition plate 602. Therefore, the inside of each storage 606a and 606b is approximately half the size of the inside of parts supplier 502, that is, the same size as the inside of parts supplier 88 of parts supply unit 82.

Therefore, inclined plate 610, conveyor device 612, an inclined plate (not illustrated), an inclined plate (not illustrated) having substantially the same dimensions as inclined plate 104, conveyor device 106, inclined plate 126, and inclined plate 128 that are arranged inside parts supplier 88, are arranged inside each storage 606a and 606b having substantially the same size as the inside of parts supplier 88 of parts supply unit 82. Inclined plate 610a, conveyor device 612a, an inclined plate (not illustrated), and an inclined plate (not illustrated) are arranged inside storage 606a, and inclined plate 610b, conveyor device 612b, an inclined plate (not illustrated), and an inclined plate (not illustrated) are arranged inside storage 606b. Further, conveyor device 612a and conveyor device 612b each individually have an electromagnetic motor (not illustrated), and conveyor device 612a and conveyor device 612b operate individually. Instead of parts supplier 502 by attaching parts supply unit 500 to parts supplier 600 having such a structure, two types of parts can be supplied, and the number and speed of each type of parts to be supplied can be controlled.

Figure 16:
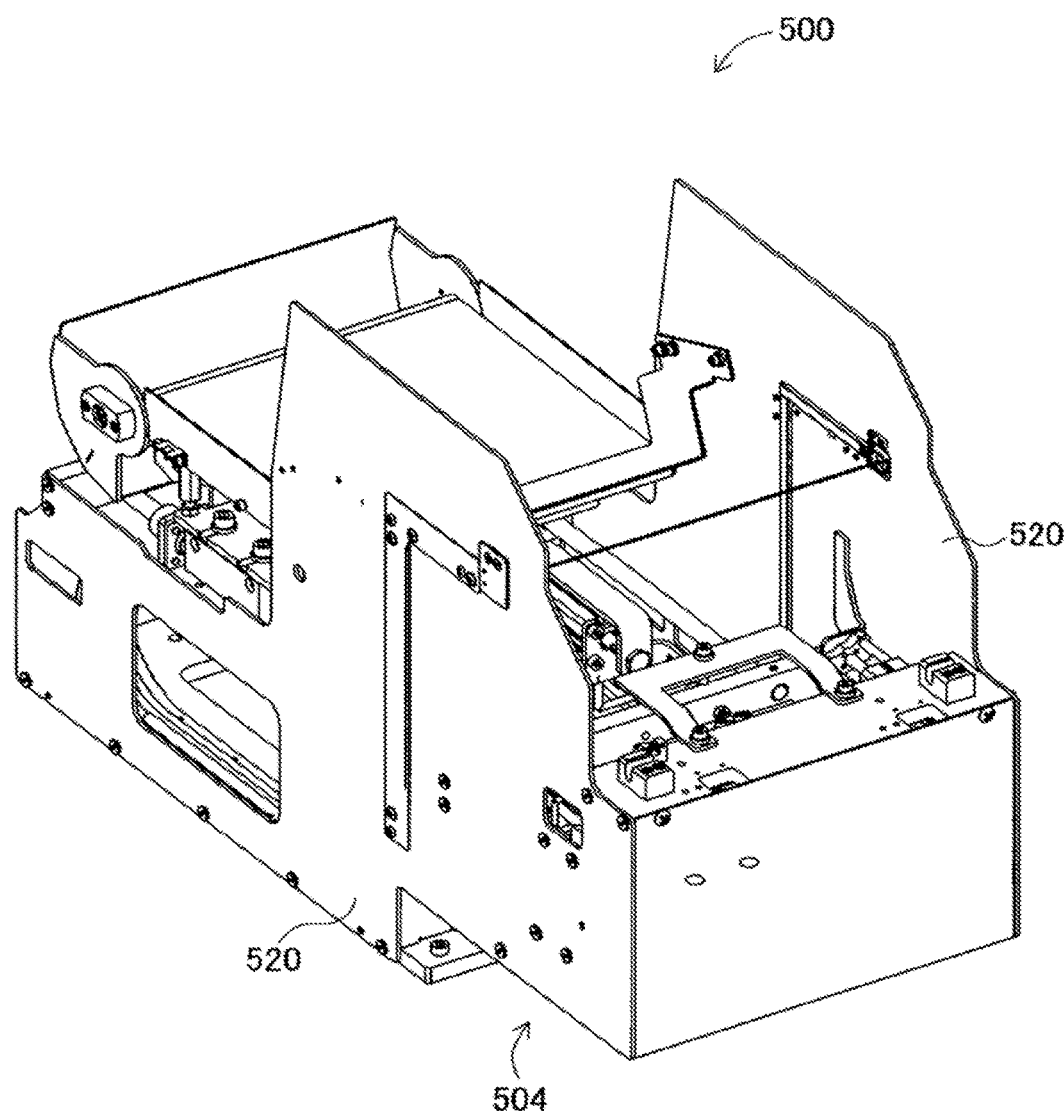
FIG. 16 is a perspective view of the parts supply unit in a state in which the parts supplier is removed.
Figure 17:
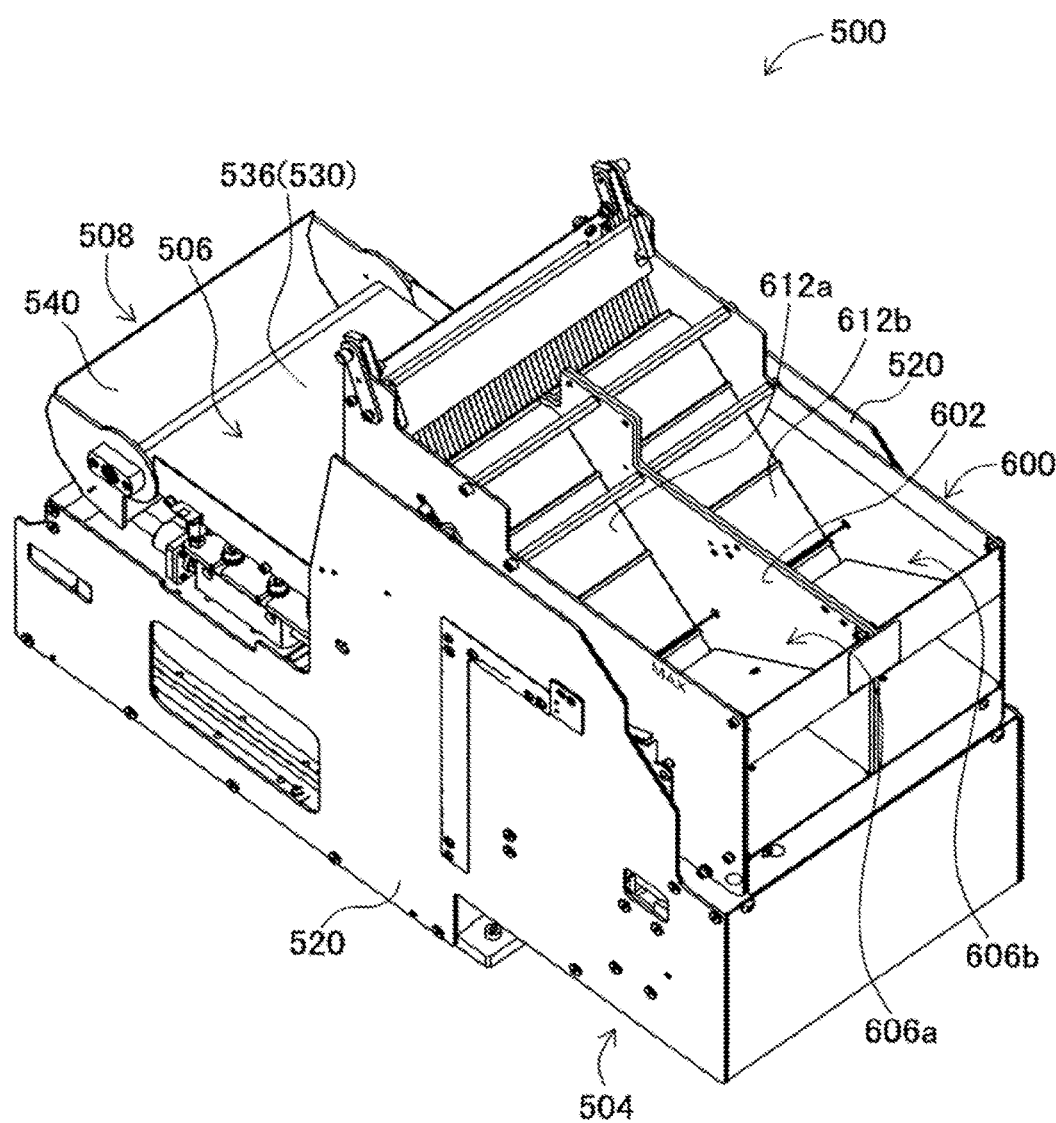
FIG. 17 is a perspective view of the parts supply unit in a state in which the parts supplier having two storages is attached.

Specifically, in parts supply unit 500, parts supplier 502 is removed from between the pair of side frames 520 of frame 504 as shown in FIG. 16. Since parts supplier 502 is positioned in frame 504 by fitting a pin (not illustrated) formed in parts supplier 502 into a fitting hole (not illustrated) formed in frame 504, by simply lifting parts supplier 502, parts supplier 502 can be removed from frame 504 with one-touch without using any tools. As shown in FIG. 17, parts supplier 600 is attached between a pair of side frame 520 of frame 504. Since parts supplier 600 has a pin (not illustrated) of the same shape is formed at the same position as parts supplier 502, by simply fitting the pin into the fitting hole formed in frame 504, parts supplier 600 can be attached to frame 504 with one-touch.

Further, in parts supplier 600 attached to frame 504, for example, parts A is input to storage 606a and parts B is input to storage 606a. Then, when discharging the parts from parts supplier 600, the operation of each of conveyor device 612a and conveyor device 612b is controlled according to the number and the size of each parts A and B to be supplied from parts supply unit 500. For example, if the parts A and the parts B have approximately similar dimensions and it is desired to supply the parts A from parts supply unit 500 twice the number of parts B, the operation of each conveyor device 612a and conveyor device 612b is controlled such that the conveyance speed of conveyor device 612a becomes twice the conveying speed of conveyor device 612b. At this time, the parts A approximately twice the number of parts B are discharged from parts supplier 600, and the parts A approximately twice the number of parts B can be scattered on stage 536. As a result, the parts A and the parts B, that is, two types of parts can be supplied from parts supply unit 500 by controlling the number of each parts. When checking the two types of parts, identification information for recognizing the type of parts to be supplied may be included in the image data, which is obtained by imaging the receiving member for accommodating the parts supplied from the parts supply apparatus from above by, for example, an imaging device having a predetermined imaging field of view.

As described above, in parts supply unit 500 to which the parts supplier 600 is attached, two storages 606a and 606b are attached to one stage 536, and parts are individually supplied from two storages 606a and 606b to one stage 536. As a result, two types of parts can be supplied from parts supply unit 500 by controlling the number of each parts. Further, since stage 536 is wide, parts can be appropriately scattered on stage 536. Furthermore, two storages 606a and 606b are formed by partitioning the inside of parts supplier 600 by partition plate 602. That is, two storages 606a and 606b are integrated, by attaching and detaching parts supplier 600 to and from frame 504, two storages 606a and 606b are integrally attached and detached to and from parts supply unit 500 in a state of being positioned with each other. As a result, two storages 606a and 606b can be attached and detached to and from parts supply unit 500 by one attachment and detachment work, and thus, the burden on the operator can be reduced.

By the way, slot 140 is an example of a slot. Parts supply unit 500 is an example of a parts supply apparatus. Frame 504 is an example of a frame. Stage 536 is an example of a stage. Storages 606a and 606b are examples of parts container.

The present disclosure is not limited to the embodiment described above, and can be implemented in various embodiments with various modifications and improvements based on the knowledge of those skilled in the art. Specifically, for example, in the embodiment described above, parts supply unit 500 is attached to slot 140 formed in main body 80 of bulk parts supply apparatus 32, but may be attached to a supply apparatus different from bulk parts supply apparatus 32, for example, a feeder, a tray type parts supply apparatus 78, or the like. Further, not limited to the supply apparatus, parts supply unit 500 may be attached to component mounter 10. Specifically, for example, parts supply unit 500 may be attached to a slot of a feeder to which a tape feeder or the like is attached. That is, parts supply unit 500 may be a supply apparatus that supplies parts to parts holding head 302 of bulk parts supply apparatus 32, or a supply apparatus that supplies parts to work heads 60 and 62 of component mounter 10. When the parts supply units of the same width are attached to all the slots of the same pitch included in the parts supply apparatus or the component mounter (work machine) without the gaps, the maximum number of parts supply units that can be attached to the parts supply apparatus or component mounter (work machine) is determined, and the unit width of the parts supply unit is also determined. The width of the unit mounting area corresponding to each slot is slightly wider than the unit width of the parts supply apparatus such an extent that the parts supply apparatus does not interfere with each other.

In the embodiment described above, stage 536 and parts supplier 600 are attached to slot 140 via frame 504, each of stage 536 and parts supplier 600 may be independently attached slot 140.

Further, in the embodiment described above, the parts are scattered on stage 536, but any surface can be used as long as the parts can be supplied. Specifically, for example, the upper surface of the conveyor belt may function as a stage, or may be a stage in which parts in the parts supplier are aligned and supplied using a pocket type such as a tray or vibration such as a bulk feeder.

Further, in the embodiment described above, different types of parts are accommodated in two storages 606a and 606b, but the same types of parts may be accommodated in two storages 606a and 606b. As described above, when the same types of parts are accommodated in two storages 606a and 606b, one type of parts may be supplied from parts supply unit 500 and the order of supplying the parts from each of the storages may be controlled.

Further, in the embodiment described above, two storages 606a and 606b are arranged for one stage 536, but three or more storages may be arranged for one stage 536. As a result, it is possible to supply more types of parts in a timely manner by one parts supply unit 500.

Further, in the embodiment described above, the width of parts supply unit 500 is twice the unit width of parts supply unit 82, but a parts supply unit having a width that is an integral multiple of three or more times the unit width of parts supply unit 82 can be adopted. Further, in parts supply unit 500, the width of parts supply unit 500 and stage 536 is twice the unit width of parts supply unit 82, however, only the width of stage 536 may be twice the unit width of parts supply unit 82 or only the width of storage may be twice the unit width of parts supply unit 82.

Further, in the embodiment described above, two storages 606a and 606b are integrated, and the two storage 606a and 606b are integrally detachably attached to frame 504, but the two storages may individually detachably attached to frame 504. Specifically, for example, two parts supplier 88 may be individually detachably attached to and detached from between a pair of side frames 520. In this case, the inside of each parts supplier 88 functions as a storage.

Further, in the embodiment described above, the present disclosure is applied to lead parts 410, the present disclosure can be applied to various types of parts. Specifically, for example, the present disclosure can be applied to configuration parts of a solar cell, configuration parts of a power module, electronic circuit parts having no leads, chip-type compact electronic parts, and the like.

REFERENCE SIGNS LIST

140: slot, 500: parts supply unit (parts supply apparatus), 504: frame, 536: stage, 606: storage (parts container)

The invention claimed is:
1. A parts supply apparatus comprising:
a parts supply unit including:
multiple parts containers configured to each accommodate multiple parts;
a partition plate that separates the parts containers in a front-rear direction;
multiple conveyors that respectively correspond to the parts containers, the conveyors being individually controllable at different speeds relative to each other; and
a stage onto which the parts conveyed from the conveyors are scattered.
2. The parts supply apparatus according to claim 1, further comprising:
a main body including multiple slots and the parts supply unit is configured to be attached to and detached from any of the slots.
3. The parts supply apparatus according to claim 1, wherein the parts containers are configured to be integrally attached to and detached from the parts supply unit in a state of being positioned with respect to each other.
4. The parts supply apparatus according to claim 1, wherein each of the parts containers accommodates one type of the parts, and
the parts containers accommodate different types of the parts from each other.
5. The parts supply apparatus according to claim 1, wherein the parts containers respectively include an inclined plate that rolls the parts toward the conveyors.

* * * * *